United States Patent
Cao

(10) Patent No.: US 10,170,977 B2
(45) Date of Patent: Jan. 1, 2019

(54) SUPPLEMENTAL CIRCUIT FOR POWER SUPPLY WITH POWER MANAGEMENT IC

(71) Applicant: Shenzhen China Star Optoelectronics Technology Co., Ltd., Shenzhen, Guangdong (CN)

(72) Inventor: Dan Cao, Guangdong (CN)

(73) Assignee: Shenzhen China Star Optoelectronics Technology Co. Ltd, Shenzhen, Guangdong (CN)

( * ) Notice: Subject to any disclaimer, the term of this patent is extended or adjusted under 35 U.S.C. 154(b) by 181 days.

(21) Appl. No.: 15/114,652

(22) PCT Filed: May 6, 2016

(86) PCT No.: PCT/CN2016/081201
§ 371 (c)(1),
(2) Date: Jul. 27, 2016

(87) PCT Pub. No.: WO2017/156839
PCT Pub. Date: Sep. 21, 2017

(65) Prior Publication Data
US 2018/0109178 A1    Apr. 19, 2018

(30) Foreign Application Priority Data
Mar. 16, 2016 (CN) .......................... 2016 1 0149300

(51) Int. Cl.
*H02B 1/24* (2006.01)
*H01H 35/00* (2006.01)
(Continued)

(52) U.S. Cl.
CPC ............... *H02M 1/44* (2013.01); *H02M 1/08* (2013.01); *H02M 3/155* (2013.01); *H03K 17/78* (2013.01);
(Continued)

(58) Field of Classification Search
CPC ........ G01R 19/32; G01R 15/18; H05B 37/02; H05B 37/00; F05F 1/46; H03J 17/06; H03J 17/063; H02M 1/08
(Continued)

(56) References Cited

U.S. PATENT DOCUMENTS 9,444,321 B2 * 9/2016 Xu .................. H02M 1/083
2009/0033244 A1 * 2/2009 Wang ................. H05B 41/295
315/291

(Continued)

FOREIGN PATENT DOCUMENTS

CN    103516187 A    1/2014
CN    103872887 A    6/2014
(Continued)

*Primary Examiner* — Rexford Barnie
*Assistant Examiner* — Jagdeep Dhillon
(74) *Attorney, Agent, or Firm* — Andrew C. Cheng

(57) ABSTRACT

The supplemental circuit is for a power supply equipped with a power management integrated circuit (PMIC). The supplemental circuit includes a detection circuit producing input signals, a switch, a signal generation circuit producing a control signal controlling the switch's open and close according to the input signals, and a RC circuit. When the switch is closed, the PMIC and the RC circuit are series-connected to ground. The supplemental circuit resolves the reduced performance of the PMIC due to the field effect transistors (FETs) inside the PMIC suffering greater switching loss when the PMIC is constantly series-connected to ground through RC circuit.

9 Claims, 2 Drawing Sheets

(51) Int. Cl.
  *H01H 83/00* (2006.01)
  *H02H 3/00* (2006.01)
  *H02M 1/44* (2007.01)
  *H02M 1/08* (2006.01)
  *H02M 3/155* (2006.01)
  *H03K 17/78* (2006.01)
  *G09G 3/00* (2006.01)
  *H03K 19/20* (2006.01)

(52) U.S. Cl.
  CPC ......... *G09G 3/006* (2013.01); *G09G 2330/06* (2013.01); *G09G 2330/12* (2013.01); *H03K 19/20* (2013.01)

(58) Field of Classification Search
  USPC ........ 307/131, 130, 128, 129; 315/291, 294, 315/292, 293; 361/54, 57, 56; 323/282
  See application file for complete search history.

(56) References Cited

U.S. PATENT DOCUMENTS

| | | | | |
|---|---|---|---|---|
| 2012/0236448 A1* | 9/2012 | Hiraoka | ................ | H02H 9/046 361/56 |
| 2012/0274233 A1* | 11/2012 | Chen | ................ | H05B 33/0815 315/294 |
| 2012/0274296 A1* | 11/2012 | Higuchi | ................ | H02M 3/156 323/282 |
| 2013/0215541 A1* | 8/2013 | Karp | ................ | H03K 19/00346 361/56 |
| 2014/0035628 A1* | 2/2014 | Oaklander | ........... | H03K 17/063 327/109 |
| 2014/0183975 A1* | 7/2014 | Wu | ....... | H02M 3/155 307/130 |
| 2015/0130436 A1 | 5/2015 | Kanamori | | |
| 2015/0380944 A1* | 12/2015 | Yu | .......... | H02J 50/12 307/104 |
| 2016/0313380 A1* | 10/2016 | Trichy | .................. | G01R 19/32 |

FOREIGN PATENT DOCUMENTS

| | | |
|---|---|---|
| CN | 105119233 A | 12/2015 |
| CN | 105261345 A | 1/2016 |
| CN | 105262057 A | 1/2016 |

* cited by examiner

SUPPLEMENTAL CIRCUIT FOR POWER SUPPLY WITH POWER MANAGEMENT IC

BACKGROUND OF THE INVENTION

1. Field of the Invention

The present disclosure relates to power management, and in particular to a supplemental circuit for a power supply equipped with a power management integrated circuit (IC).

2. The Related Arts

Currently, a power management integrated circuit (PMIC) is usually integrated with some addition circuits into a circuit of a specific function such as a booster circuit or a down circuit. In the field of display device, to resolve the electromagnetic interference (EMI) to a display device, the PMIC in the display device's power supply has its ON/OFF terminal series-connected to ground through a RC circuit, as illustrated in FIG. 1. The EMI problem is indeed improved in this way. However, field effect transistors (FETs) inside the PMIC suffer greater switching loss, leading to reduced performance of the PMIC.

SUMMARY OF THE INVENTION

Therefore, an objective of the present disclosure is to provide a supplemental circuit for a power supply equipped with a power management integrated circuit (PMIC) so as to resolve the reduced performance of the PMIC due to the field effect transistors (FETs) inside the PMIC suffering greater switching loss when the PMIC is constantly series-connected to ground through RC circuit.

The supplemental circuit includes a detection circuit producing input signals, a switch, a signal generation circuit producing a control signal controlling the switch's open and close according to the input signals, and a RC circuit. When the switch is closed, the PMIC and the RC circuit are series-connected to ground.

The detection circuit includes a first detection sub-circuit detecting an input current to the power supply and, according to the detected input current, producing a first input signal for controlling the switch's open and close, a second detection sub-circuit detecting an output current from the power supply and, according to the detected output current, producing a second input signal for controlling the switch's open and close, and a third detection sub-circuit detecting a mode of a display device incorporating the power supply and, according to the detected mode, producing a third input signal for controlling the switch's open and close. The signal generation circuit produces the control signal controlling the switch's open and close according to the first, second, and third input signals.

When the first, second, and third input signals are all for closing the switch, the signal generation circuit produces the control signal that closes the switch and, when the first, second, and third input signals are not all for closing the switch, the signal generation circuit produces the control signal that opens the switch.

The first detection sub-circuit includes a first optical coupler and a first comparator. The first optical coupler detects and couples the input current of the power supply. The first comparator compares a first voltage from the first optical coupler and a first reference voltage, and produces the first input signal for controlling the switch's open and close according to comparison result.

When the first voltage is greater than the first reference voltage, the first comparator produces the first input signal for closing the switch. When the first voltage is less than the first reference voltage, the first comparator produces the first input signal for opening the switch.

The second detection sub-circuit includes a second optical coupler and a second comparator. The second optical coupler detects and couples the output current of the power supply. The second comparator compares a second voltage from the second optical coupler and a second reference voltage, and produces the second input signal for controlling the switch's open and close according to comparison result.

When the second voltage is greater than the second reference voltage, the second comparator produces the second input signal for closing the switch. When the second voltage is less than the second reference voltage, the second comparator produces the second input signal for opening the switch.

When the third detection sub-circuit detects that the display device where the PMIC is configured is under an EMI test mode, the third detection sub-circuit produces the third input signal for closing the switch. When the third detection sub-circuit detects that the display device where the PMIC is configured is under the normal mode, the third detection sub-circuit produces the third input signal for opening the switch.

The third detection sub-circuit is a timing controller.

The signal generation circuit is an AND-gate circuit.

As described, the supplemental circuit is capable of series-connecting the PMIC to ground through the RC circuit selectively, not only resolving the EMI problem but also balancing the performance of the PMIC.

BRIEF DESCRIPTION OF THE DRAWINGS

To make the technical solution of the embodiments according to the present disclosure, a brief description of the drawings that are necessary for the illustration of the embodiments will be given as follows. Apparently, the drawings described below show only example embodiments of the present disclosure and for those having ordinary skills in the art, other drawings may be easily obtained from these drawings without paying any creative effort. In the drawings.

DETAILED DESCRIPTION OF THE PREFERRED EMBODIMENTS

Exemplary embodiments of the present disclosure are provided below so as to explain the present disclosure in details along with the accompanied drawings where same numerals are used to refer to same parts.

Figure 1:
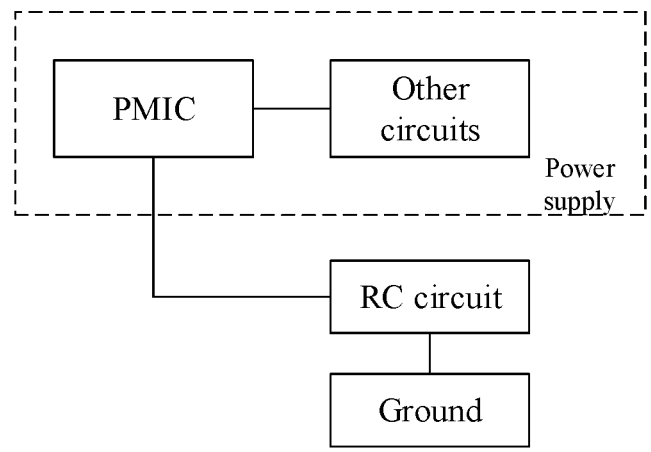
FIG. 1 is a block diagram showing a conventional power supply series-connecting a RC circuit.
Figure 2:
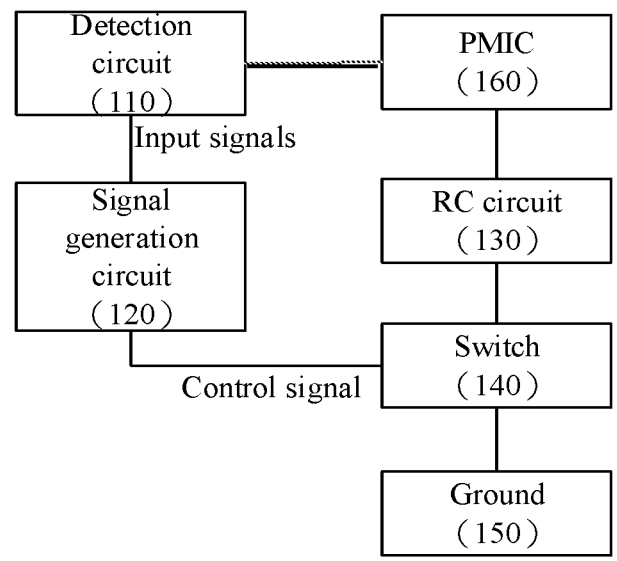
FIG. 2 is a block diagram showing a supplemental circuit for a power supply with a power management integrated circuit (PMIC) according to an embodiment of the present disclosure.

FIG. 2 is a block diagram showing a supplemental circuit for a power supply with a power management integrated circuit (PMIC) according to an embodiment of the present disclosure.

As illustrated, the supplemental circuit includes a detection circuit 110, a signal generation circuit 120, a RC circuit 130, and a switch 140 for a power supply equipped with a PMIC 160.

Specifically, the detection circuit 110 produces input signals.

The signal generation circuit 120 produces a control signal according to the input signals from the detection circuit 110 for opening and closing the switch 140.

For example, the signal generation circuit 120 may be any unit circuit capable of basic and combinatory logic computation such as AND-gate circuit, OR-gate circuit, or NOT-gate circuit.

The switch 140 is opened or closed according to the control signal. For example, the switch 140 may be a NMOS field effect transistor (FET) or a PMOS FET that can be used as an electronic switch. Specifically, when the switch 140 is closed, the PMIC 160, the RC circuit 130, and ground 150 are series-connected. On the other hand, when the switch 140 is opened, the PMIC 160, the RC circuit 130, and ground 150 are not series-connected. Please note that the switch 140 may be configured at any place that can series-connect the PMIC 160, the RC circuit 130, and ground 150, and is not limited to be between the RC circuit 130 and ground 150. For example, the switch 140 may be configured between the PMIC 160 and the RC circuit 130.

As such, the switch 140 controls whether the PMIC 160 and the RC circuit 130 is series-connected to ground 150, therefore obviating the adverse effect of having the RC circuit 130 constantly series-connected between the PMIC 160 and the ground 150.

Figure 3:
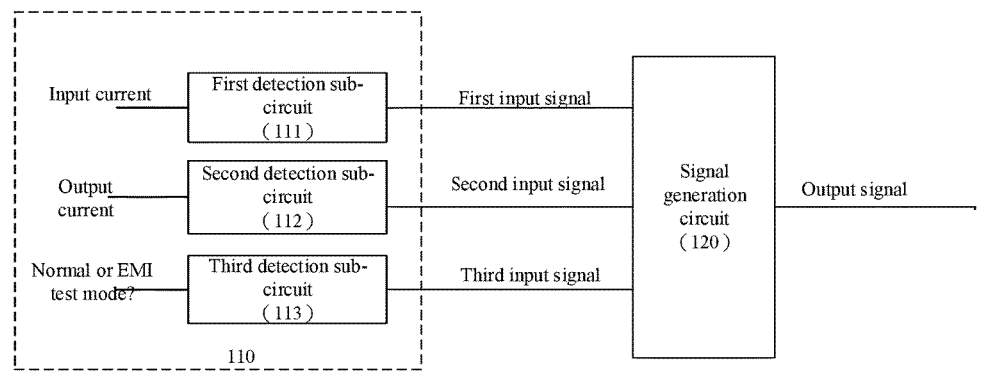
FIG. 3 is a block diagram showing a detection circuit of the supplemental circuit of FIG. 2.

FIG. 3 is a block diagram showing the detection circuit 110 of the supplemental circuit of FIG. 2.

As illustrated, the detection circuit 110 includes a first detection sub-circuit 111, a second detection sub-circuit 112, and a third detection sub-circuit 113.

The first detection sub-circuit 111 detects an input current to the power supply and, according to the detected input current, produce a first input signal to the switch 140 to open and close the switch 140.

The second detection sub-circuit 112 detects an output current from the power supply and, according to the detected output current, produces a second input signal to the switch 140 to open and close the switch 140.

The third detection sub-circuit 113 detects a mode of a display device incorporating the power supply and, according to the detected mode, produces a third input signal to the switch 140 to open and close the switch 140. The mode of the display device refers to a normal mode or an electromagnetic interference (EMI) test mode. Specifically, when the third detection sub-circuit 113 detects that the display device is in the EMI test mode, the third detection sub-circuit 113 produces the third input signal for opening and closing the switch 140. On the other hand, when the third detection sub-circuit 113 detects that the display device is in the normal mode, the third detection sub-circuit 113 produces the third input signal for opening and closing the switch 140. The third detection sub-circuit 113 may be a timing controller.

The signal generation circuit 120 produces a control signal opening and closing the switch 140 according to the first, second, and third input signals. Specifically, when the first, second, and third input signals S1, S2, and S3 are all for closing the switch 140, the signal generation circuit 120 produces the control signal that closes the switch 140. When the first, second, and third input signals S1, S2, and S3 are not all for closing the switch 140, the signal generation circuit 120 produces the control signal that opens the switch 140. For example, when the switch 140 is a NMOS FET that is closed (or conducted) by a high-level signal, and the signal generation circuit 120 is an AND-gate circuit, the signal generation circuit 120 is able to produce a high-level signal to close the switch 140 when the first, second, and third input signals are all high-level signals.

Figure 4:
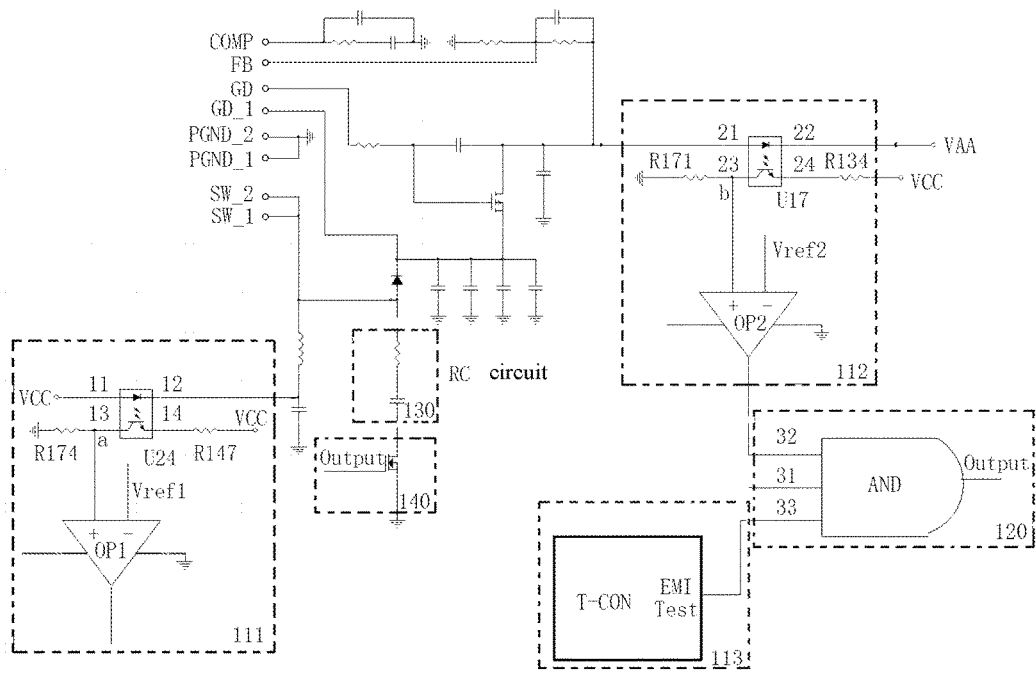
FIG. 4 is a schematic diagram showing a supplemental circuit for a power supply with a PMIC according to an embodiment of the present disclosure.

FIG. 4 is a schematic diagram showing a supplemental circuit for a power supply with a PMIC according to an embodiment of the present disclosure.

As illustrated, the first detection sub-circuit 111 includes a first optical coupler U24 and a first comparator OP1. The first detection sub-circuit 111 further includes a first resistor R174 and a second resistor R147. Specifically, the first optical coupler U24 has a first terminal 11 connected to a voltage source VCC, a second terminal 12 connected to an end of an inductor whose another end is connected to switch control pins SW of the PMIC (the present embodiment uses a PMIC whose model number is HX5562R11U as example, but the present disclosure is not limited as such), a third terminal 13 connected to the an end of the first resistor R174 whose another end is connected to ground, and a fourth terminal 14 connected to an end of the second resistor R147 whose another end is connected to voltage source VCC. The first comparator OP1 has the non-inverting terminal connected to the third terminal 13 of the first optical coupler U24, the inverting terminal connected to a first reference voltage Vref1, and the output terminal connected to a first input terminal 31 of the signal generation circuit 120.

The second detection sub-circuit 112 includes a second optical coupler U17 and a second comparator OP2. The second detection sub-circuit 112 further includes a third resistor R171 and a fourth resistor R134. Specifically, the second optical coupler U17 has a first terminal 21 connected to a gate control pin GD of the PMIC (the present embodiment uses a PMIC whose model number is HX5562R11U as example, but the present disclosure is not limited as such) through series-connected capacitor and resistor, a second terminal 22 connected to an output voltage VAA, a third terminal 23 connected to the an end of the third resistor R171 whose another end is connected to ground, and a fourth terminal 24 connected to an end of the fourth resistor R134 whose another end is connected to voltage source VCC. The second comparator OP2 has the non-inverting terminal connected to the third terminal 23 of the second optical coupler U17, the inverting terminal connected to a second reference voltage Vref2, and the output terminal connected to a second input terminal 32 of the signal generation circuit 120.

The third detection sub-circuit 113 is a timing controller (T-CON) whose EMI test pin is connected to a third input terminal of the signal generation circuit 120 which is an AND-gate circuit with three input terminals and an output terminal. The three input terminals receive the first input signal, the second input signal, and the third input signal, respectively. The output terminal is connected to the switch 140 to control the switch 140's open and close through the output control signal.

The supplemental circuit operates as follows.

The first optical coupler U24 detects and couples the input current from the voltage source VCC. The first comparator OP1 compares a first voltage Va coupled from the first optical coupler U24 and the first reference voltage Vref1, and produces the first input signal for controlling the switch 140's open and close according to the comparison result. For example, when the first voltage Va is greater than the first reference voltage Vref1, the first comparator OP1 produces the first input signal for closing the switch 140. When the first voltage Va is less than the first reference voltage Vref1, the first comparator OP1 produces the first input signal for opening the switch 140. In other words, when the display device incorporating the PMIC 160 switches from the normal mode to the EMI test mode, the input current flowing from the first terminal 11 to the second terminal 12 of the first optical coupler U24 increases. According to the operation principle of optical coupler, the current flowing from the third terminal 13 to the fourth terminal 14 of first optical coupler U24 increases as well. Therefore the current flowing through the first resistor R174 increases, and the voltage at the third terminal 13 of the first optical coupler U24 (i.e., the voltage Va at the junction a) increases. When the voltage Va at the third terminal 13 of the first optical coupler U24 is greater than the first reference voltage Vref1, the first comparator OP1 produces the first input signal at its output terminal for closing the switch 140. When the voltage Va at the third terminal 13 of the first optical coupler U24 is less than the first reference voltage Vref1, the first comparator OP1 produces the first input signal at its output terminal for opening the switch 140.

The second optical coupler U17 detects and couples the output current from the voltage source VAA. The second comparator OP2 compares a second voltage Vb coupled from the second optical coupler U17 and the second reference voltage Vref2, and produces the second input signal for controlling the switch 140's open and close according to the comparison result. For example, when the second voltage Vb is greater than the second reference voltage Vref2, the second comparator OP2 produces the second input signal for closing the switch 140. When the second voltage Vb is less than the second reference voltage Vref2, the second comparator OP2 produces the second input signal for opening the switch 140. In other words, when the display device incorporating the PMIC 160 switches from the normal mode to the EMI test mode, the input current flowing from the first terminal 21 to the second terminal 22 of the second optical coupler U17 increases. According to the operation principle of optical coupler, the current flowing from the third terminal 23 to the fourth terminal 24 of second optical coupler U17 increases as well. Therefore the current flowing through the third resistor R171 increases, and the voltage at the third terminal 23 of the second optical coupler U17 (i.e., the voltage Vb at the junction b) increases. When the voltage Vb at the third terminal 23 of the second optical coupler U17 is greater than the second reference voltage Vref2, the second comparator OP2 produces the second input signal at its output terminal for closing the switch 140. When the voltage Vb at the third terminal 23 of the second optical coupler U17 is less than the second reference voltage Vref2, the second comparator OP2 produces the second input signal at its output terminal for opening the switch 140.

The timing controller T-CON detects the mode of the display device incorporating the power supply, and produces the third input signal for controlling the switch 140's open and close according to the detected mode. For example, when the timing controller T-CON detects that the display device where the PMIC 160 is configured is under the EMI test mode, the timing controller T-CON and the AND-gate circuit produces the third input signal for closing the switch 140. When the timing controller T-CON detects that the display device where the PMIC 160 is configured is under the normal mode, the timing controller T-CON and the AND-gate circuit produces the third input signal for opening the switch 140.

The AND-gate circuit receives the first, second, and third input signals, and produces the control signal for closing and opening the switch 140 accordingly. For example, if the switch 140 is a NMOS FET, and the first, second, and third input signals are high-level signals, the AND-gate circuit 120 produces a high-level signal to close (conduct) the switch 140 so that the PMIC 160, the RC circuit 130, and ground 150 are series-connected. In addition, the other circuit shown in FIG. 4 has a boost effect.

As described above, the supplemental circuit is capable of series-connecting the PMIC to ground through the RC circuit selectively, not only resolving the EMI problem but also balancing the performance of the PMIC.

Embodiments of the present disclosure have been described, but not intending to impose any unduly constraint to the appended claims. Any modification of equivalent structure or equivalent process made according to the disclosure and drawings of the present disclosure, or any application thereof, directly or indirectly, to other related fields of technique, is considered encompassed in the scope of protection defined by the claims of the present disclosure.

What is claimed is:

1. A supplemental circuit for a power supply equipped with a power management integrated circuit (PMIC), comprising:
    a detection circuit producing input signals;
    a switch;
    a signal generation circuit producing a control signal controlling the switch's open and close according to the input signals; and
    a RC circuit;
    wherein when the switch is closed, the PMIC and the RC circuit are series-connected to ground;
    wherein the detection circuit comprises:
    a first detection sub-circuit detecting an input current to the power supply and, according to the detected input current, producing a first input signal for controlling the switch's open and close;
    a second detection sub-circuit detecting an output current from the power supply and, according to the detected output current, producing a second input signal for controlling the switch's open and close; and
    a third detection sub-circuit detecting a mode of a display device incorporating the power supply and, according to the detected mode, producing a third input signal for controlling the switch's open and close;
    wherein the signal generation circuit produces the control signal controlling the switch's open and close according to the first, second, and third input signals.

2. The supplemental circuit as claimed in claim 1, wherein when the first, second, and third input signals are all for closing the switch, the signal generation circuit produces the control signal that closes the switch; and, when the first, second, and third input signals are not all for closing the switch, the signal generation circuit produces the control signal that opens the switch.

3. The supplemental circuit as claimed in claim 1, wherein the first detection sub-circuit comprises a first optical coupler and a first comparator; the first optical coupler detects and couples the input current of the power supply; the first comparator compares a first voltage from the first optical coupler and a first reference voltage, and produces the first input signal for controlling the switch's open and close according to comparison result.

4. The supplemental circuit as claimed in claim 3, wherein when the first voltage is greater than the first reference voltage, the first comparator produces the first input signal for closing the switch; and, when the first voltage is less than the first reference voltage, the first comparator produces the first input signal for opening the switch.

5. The supplemental circuit as claimed in claim 1, wherein the second detection sub-circuit comprises a second optical coupler and a second comparator; the second optical coupler detects and couples the output current of the power supply; the second comparator compares a second voltage from the second optical coupler and a second reference voltage, and produces the second input signal for controlling the switch's open and close according to comparison result.

6. The supplemental circuit as claimed in claim 5, wherein when the second voltage is greater than the second reference voltage, the second comparator produces the second input signal for closing the switch; and, when the second voltage is less than the second reference voltage, the second comparator produces the second input signal for opening the switch.

7. The supplemental circuit as claimed in claim 1, wherein when the third detection sub-circuit detects that the display device where the PMIC is configured is under an EMI test mode, the third detection sub-circuit produces the third input signal for closing the switch; and, when the third detection sub-circuit detects that the display device where the PMIC is configured is under the normal mode, the third detection sub-circuit produces the third input signal for opening the switch.

8. The supplemental circuit as claimed in claim 7, wherein the third detection sub-circuit is a timing controller.

9. The supplemental circuit as claimed in claim 1, wherein the signal generation circuit is an AND-gate circuit.

* * * * *